(12) United States Patent
Conner (10) Patent No.: US 8,269,520 B2
(45) Date of Patent: Sep. 18, 2012

(54) USING PATTERN GENERATORS TO CONTROL FLOW OF DATA TO AND FROM A SEMICONDUCTOR DEVICE UNDER TEST

(75) Inventor: George W. Conner, Camarillo, CA (US)

(73) Assignee: Teradyne, Inc., North Reading, MA (US)

( * ) Notice: Subject to any disclaimer, the term of this patent is extended or adjusted under 35 U.S.C. 154(b) by 379 days.

(21) Appl. No.: 12/575,800

(22) Filed: Oct. 8, 2009

(65) Prior Publication Data

US 2011/0087942 A1    Apr. 14, 2011

(51) Int. Cl.
*G01R 31/02* (2006.01)

(52) U.S. Cl. ................ 324/762.01; 324/762.02

(58) Field of Classification Search .................. None
See application file for complete search history.

(56) References Cited

U.S. PATENT DOCUMENTS

| | | | | |
|---|---|---|---|---|
| 5,107,205 A * | 4/1992 | Ebihara | | 714/740 |
| 2005/0154953 A1* | 7/2005 | Norskog | | 714/738 |
| 2008/0034265 A1* | 2/2008 | Kang | | 714/736 |
| 2008/0231297 A1* | 9/2008 | Kang | | 324/755 |
| 2009/0265597 A1* | 10/2009 | Suda | | 714/738 |

\* cited by examiner

*Primary Examiner* — Vinh Nguyen (74) *Attorney, Agent, or Firm* — Fish & Richardson P.C.

(57) ABSTRACT

A semiconductor device tester includes programmable hardware configured to test a semiconductor device under test. The programmable hardware is programmed with two or more pattern generators to control a flow of data to and from the semiconductor device under test.

20 Claims, 10 Drawing Sheets

| Opcode | Care | Word3 | Word2 | Word1 | Word0 | |
|---|---|---|---|---|---|---|
| Reset | M | | | D10.2 | K28.5 | |
| Wait_MCH | | | | | | |
| Reset | M | | | D10.2 | K28.5 | |
| Wait_MCH | | | | | | |
| Reset | M | | | D10.2 | K28.5 | |
| Wait_MCH | | | | | | |
| Reset | M | | | D10.2 | K28.5 | |
| Wait_MCH | | | | | | |
| Reset | M | | | D10.2 | K28.5 | |
| Wait_MCH | | | | | | |
| Reset | M | | | D10.2 | K28.5 | |
| Wait_MCH | | | | | | |
| Set_TX | 1111 | 0 | 0 | 0 | 0 | ⎫ |
| Reset | M | | | D10.2 | K28.5 | |
| Wait_MCH | | | | | | |
| Reset | M | | | D10.2 | K28.5 | |
| Wait_MCH | | | | | | ⎬ 360 |
| Reset | M | | | D10.2 | K28.5 | |
| Wait_MCH | | | | | | OOB Sequence |
| Reset | M | | | D10.2 | K28.5 | |
| Wait_MCH | | | | | | |
| Reset | M | | | D10.2 | K28.5 | |
| Wait_MCH | | | | | | |
| Reset | M | | | D10.2 | K28.5 | |
| Wait_MCH | | | | | | |
| Set_TX | 1111 | 0 | 0 | 0 | 0 | ⎭ |
| Reset | M | | | D10.2 | K28.5 | ⎫ |
| Wait_MCH | | | | | | ⎬ Idle Sequence |
| Set_TX | | | | | | 362 |
| Reset | M | | | D21.5 | D21.5 | ⎭ |
| Wait_MCH | | | | | | |
| Set_TX | | | | | | |
| Reset | M | | | D21.5 | D21.5 | |
| Wait_MCH | | | | | | |
| Set_TX | | | | | | |
| Reset | M | | | D23.5 | D23.1 | |
| Wait_MCH | | | | | | ⎬ 364 |
| SET_CAP_OFF | | | | | | |
| RESET | M | | | D21.0 | D21.5 | Receive Packet |
| SET_CAP_OFF | | | | | | |
| Reset | M | | | D21.4 | D21.5 | |
| Wait_MCH | | | | | | |
| Set_TX | | | | | | |
| Reset | M | | | D10.2 | D21.4 | |
| Wait_MCH | | | | | | ⎬ 366 |
| Set_TX | | | | | | |
| Reset | M | | | D21.2 | D21.2 | Transmit Packet |
| Wait_MCH | | | | | | |
| Reset | | | | D21.1 | D21.1 | |
| Wait_MCH | M | | | | | |
| Set_TX | | | | | | |

FIG.10

USING PATTERN GENERATORS TO CONTROL FLOW OF DATA TO AND FROM A SEMICONDUCTOR DEVICE UNDER TEST

BACKGROUND

As commercial demand for semiconductor devices (e.g., memory chips and microprocessors) increases, testing of these devices has become critical for device manufacturers. To perform such tests, semiconductor device testers, such as automatic testing equipment ("ATE"), are used to characterize and to validate the performance of manufactured semiconductor devices. Many ATEs perform system level testing in which the hardware of the ATE is configured specifically for a semiconductor device under test ("DUT").

For some types of tests, the ATE sends the DUT signals, such as direct current signals. Some ATEs include a single pattern generator that is used to generate the signals sent to the DUT. Based on the signals generated by the pattern generator, the ATE sends a signal to the DUT and the DUT responds by sending some data back to the ATE.

SUMMARY

In general, in an aspect, a semiconductor device tester includes programmable hardware configured to test a semiconductor device under test. The programmable hardware is programmed with two or more pattern generators to control a flow of data to and from the semiconductor device under test. The two dr more pattern generators are programmed to transmit data to a semiconductor device under test and receive data from the semiconductor device under test. One of the pattern generators includes a transmit programmable pattern generator to transmit data to the semiconductor device under test. Another one of the pattern generators includes a receive programmable pattern generator to receive data from the semiconductor device under test. The receive programmable pattern generator is configured to execute one or more operation codes against the data received from the semiconductor device under test. The transmit programmable pattern generator and the receive programmable pattern generator are in communication. The receive pattern generator sends a message to the transmit pattern generator, the message indicating that the transmit pattern generator should send data to the semiconductor device under test. The transmit pattern generator is programmed to execute one or more operation codes specifying the data to be transmitted. The receive programmable pattern generator is configured to send the transmit programmable pattern generator a message, the message including data indicating that the transmit programmable pattern generator should transmit data to the semiconductor device under test.

Implementations may include one or more of the following features. The semiconductor device tester also includes a data controller to control the flow of data out of and into the programmable hardware. The data controller is in communication with the transmit programmable pattern generator and the data controller is configured to send a command to the transmit programmable pattern generator, the command including data specifying one or more operation codes to be executed by the transmit programmable pattern generator. The data controller is in communication with the receive programmable pattern generator and the data controller is configured to send a command to the receive programmable pattern generator, the command including data specifying one or more operation codes to be executed by the receive programmable pattern generator In general, in an aspect, a method of testing a semiconductor device includes programming hardware to test the semiconductor device. The hardware includes a transmit pattern generator that is capable of being programmed with operation codes to send bits of data to the semiconductor device under test and a receive pattern generator that is capable of being programmed with operation codes to perform data operations on the received bits of data. The method also includes sending one or more bits of data to a semiconductor device under test, and receiving one or more bits of data from a semiconductor device under test. The method also includes executing, by the transmit pattern generator, one or more operation codes specifying the data to be sent. The method also includes executing one or more operation codes against the one or more bits of data received from the semiconductor device under test.

The transmit pattern generator waits to receive an electrical signal from the receive pattern generator prior to sending bits of data to the semiconductor device under test.

In general, in an aspect, a semiconductor device includes programmable hardware programmed with a receive pattern generator and a transmit pattern generator. The transmit pattern generator is configured to transmit one or more bits of data to a semiconductor device under test. The receive pattern generator is configured to communicate with the transmit pattern generator. The receive pattern generator is configured to receive one or more bits of data from the semiconductor device under test. The transmit pattern generator is configured to wait to receive a signal from the receive pattern generator prior to sending one or more second bits of data to the semiconductor device under test.

The details of one or more embodiments are set forth in the accompanying drawings and the description below. Other features, objects, and advantages will be apparent from the description and drawings, and from the claims.

DETAILED DESCRIPTION

Figure 1:
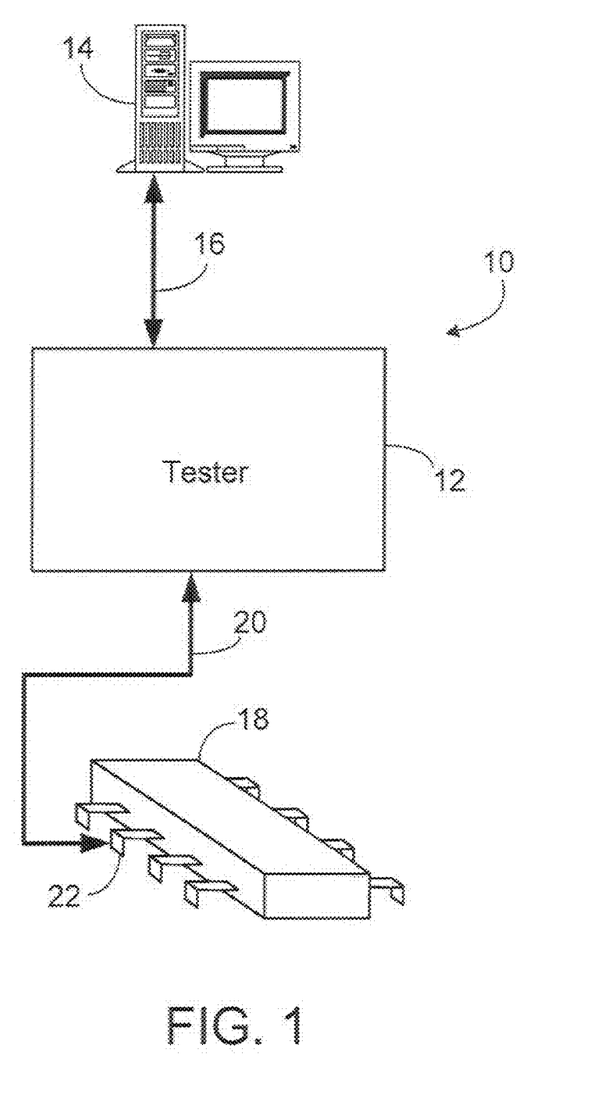
FIG. 1 is a block diagram of ATE for testing devices.

Referring to FIG. 1, an ATE system 10 for testing a device-under-test (DUT) 18, such as a semiconductor device, includes a tester 12. To control tester 12, system 10 includes a computer system 14 that interfaces with tester 12 over a hardwire connection 16. Typically, computer system 14 sends commands to tester 12 to initiate execution of routines and functions for testing DUT 18. Such executing test routines may initiate the generation and transmission of test signals to the DUT 18 and collect responses from the DUT. Various types of DUTs may be tested by system 10. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., as many as sixty-four or one hundred twenty-eight connector pins (or more) may be interfaced to tester 12. For illustrative purposes, in this example, semiconductor device tester 12 is connected to one connector pin of DUT 18 via a hardwire connection. A conductor 20 (e.g., cable) is connected to pin 22 and is used to deliver test signals (e.g., parametric measurement unit ("PMU") test signals, pin electronics ("PE") test signals, etc.) to the internal circuitry of DUT 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, a two-port test may also be performed by semiconductor device tester 12. For example, a test signal may be injected over conductor 20 into pin 22 and a response signal may be collected from one or more other pins of DUT 18. This response signal is provided to semiconductor device tester 12 to determine quantities, such as gain response, phase response, and other throughput measurement quantities.

Figure 2:
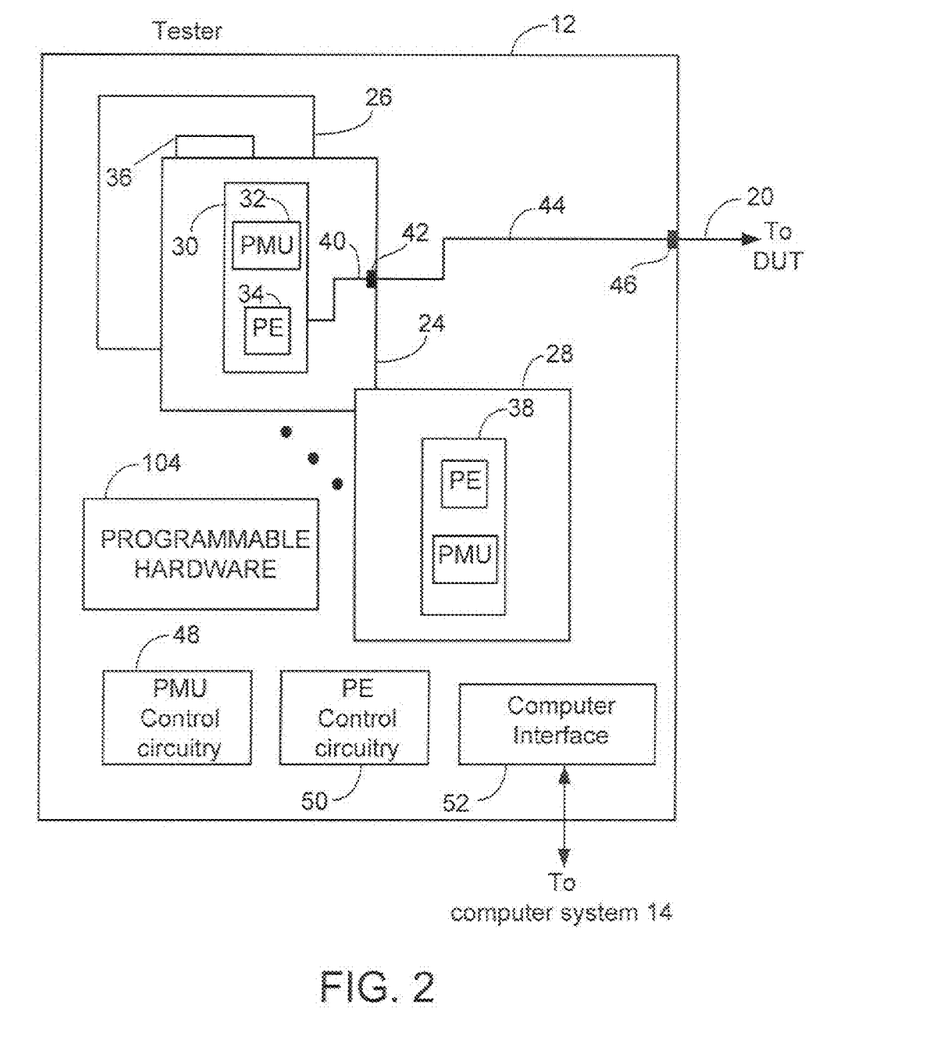
FIG. 2 is a block diagram of a tester used in the ATE.

Referring also to FIG. 2, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect corresponding responses. Each communication link to a pin is typically referred to as a channel and, by providing test signals to a large number of channels, testing time is reduced since multiple tests may be performed simultaneously. Along with having many channels on an interlace card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes IC chip 30 for performing parametric measurement unit (PMU) tests and pin electronics (PE) tests. IC chip 30 has a PMU stage 32 that includes circuitry for performing PMU tests and a PE stage 34 that includes circuitry for performing PE tests. Additionally, interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals, or waveforms, to a DUT (e.g., DUT 18) and collecting responses to further characterize the performance of the DUT. For example, IC chip 30 may transmit (to the DUT) AC test signals that represent a vector of binary values for storage on the DUT. Once these binary values have been stored, the DUT may be accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32.

To pass both DC and AC test signals from interface card 24 to DUT 18, a conducting trace 40 connects IC chip 30 to an interface board connector 42 that allows signals to be passed on and off interface board 24. Interface board connector 42 is also connected to a conductor 44 that is connected to an interface connector 46, which allows signals to be passed to and from tester 12. In this example, conductor 20 is connected to interface connector 46 for bi-directional signal passage between tester 12 and pin 22 of DUT 18. In some arrangements, an interface device may be used to connect one or more conductors from tester 12 to the DUT. For example, the DUT (e.g., DUT 18) may be mounted onto a device interface board (DIB) for providing access to each DUT pin. In such an arrangement, conductor 20 may be connected to the DIB for placing test signals on the appropriate pin(s) (e.g., pin 22) of the DUT.

In this example, only conducting trace 40 and conductor 44 respectively connect IC chip 30 and interface board 24 for delivering and collecting signals. However, IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIBs for interfacing the channels provided by interface cards 24, 26, and 28 to one or multiple devices under test.

The tester 12 includes programmable hardware 104, such as a field-programmable gate array ("FPGA") semiconductor device, that is capable of being programmed such that the tester 12 responds to the DUT 18. The programmable hardware 104 connects to a pin electronics chip, which is connected to the DUT 18

Figure 3:
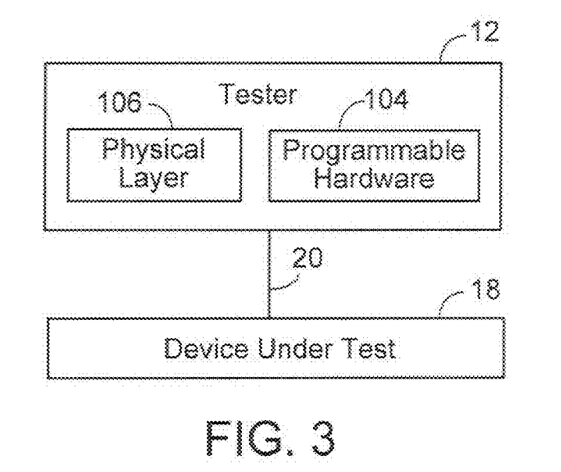
FIG. 3 is a schematic of semiconductor device tester.

Referring to FIG. 3, the tester 12 includes a physical layer 106 that includes hardware transmission technologies. For example, physical layer 106 controls how data is sent to and received from the DUT 18. In some examples, the physical layer 106 specifies bit-by-bit delivery from the DUT 18 to the tester 12. The physical layer is not protocol-specific and is capable of being used in conjunction with various types of protocols and interfaces used on ports of the DUT 18, such as Serial Advanced Technology Attachment ("SATA") and High-Definition Multimedia Interface ("HDMI") In the tester 12, the details of timing and clock recovery are handled at the physical layer 106 and the programmable hardware 104 controls the level of information (i.e., bits of data) to be transferred between the tester 12 and the DUT 18.

Programmable hardware 104 is capable of being programmed, for example by a user of the tester 12, so the tester 12 uses varying protocols on ports of the DUTs during testing. The programmable hardware 104 may be programmed to the proper protocol and uses that protocol to communicate with the DUT 18. Through the programmable hardware 104, the tester 12 is "protocol aware," because the tester 12 sends data to a port on the DUT 18 using the protocol for that port. Additionally, the tester 12 is capable of debugging an array of DUT problems or testing DUTs 18 for which the tester 12 has no built-in protocol support Because the tester 12 is capable of being programmed to respond to the DUT 18, the tester 12 is capable of establishing a connection ("handshake") with the DUT 18. The handshake includes verification of the connection, the speed, protocol specifics, and algorithms being used on the DUT 18. In some examples, a handshake is needed to bring up the serial ports on a DUT 18 before the tester 12 tests the DUT 18.

Figure 4:
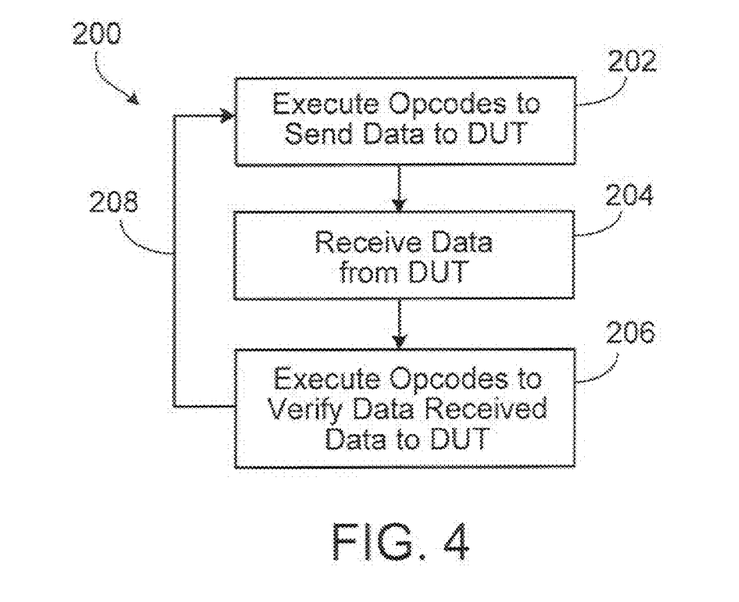
FIGS. 4, 6 and 8 are process flow diagrams of processes performed by a semiconductor device tester.

The programmable hardware 104 is capable of being programmed with various operation codes ("opcodes") that specify bits of data to send to the DUT 18. The programmable hardware 104 is also capable of being programmed with opcodes that specify operations to be performed by the programmable hardware 104 after receiving data from the DUT 18. Referring to FIG. 4, the programmable hardware 104 performs various actions 200 in performing a handshake with, or bringing up, the ports of the DUT 18. The programmable hardware 104 executes (202) an opcode that sends bits of data to the DUT 18. The programmable hardware 104 receives (204) bits of data hack from the DUT 18. The programmable hardware 104 executes (206) more opcodes to verify or perform another function on the data received. Examples of these functions include testing algorithms for testing the DUT 18. The programmable hardware also executes (208) additional opcodes to send more bits of data to the DUT 18. These actions (202, 204, 206) may be continued until the DUT 18 has been tested.

Figure 5:
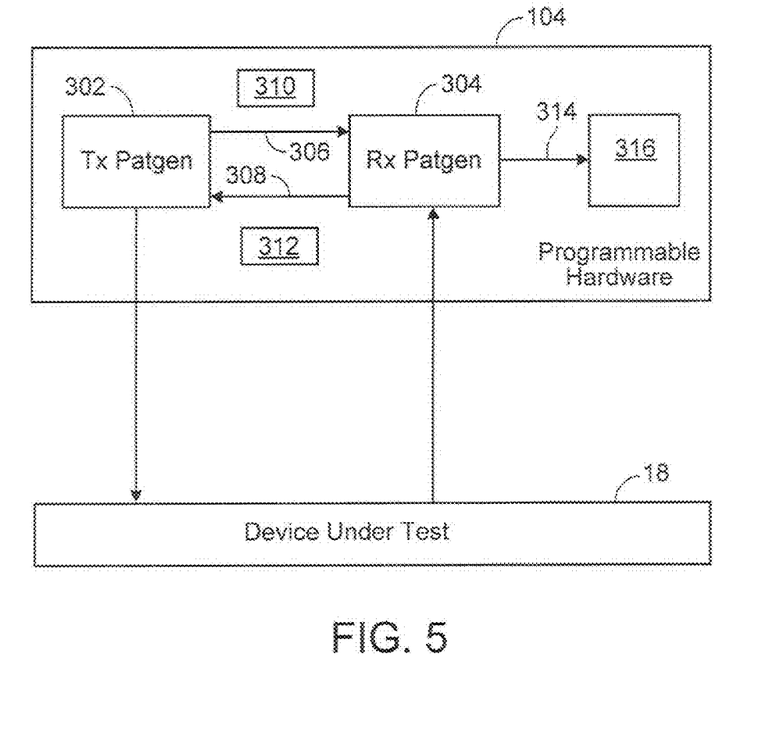
FIGS. 5 and 7 are diagrams of programmable hardware.

Referring to FIG. 5, programmable hardware 104 may include two pattern generators, namely a transmit pattern generator 302 ("Tx Patgen") and a receive pattern generator 304 ("Rx Patgen"). A library of programs is provided to the programmable hardware 104. The library of programs includes code that defines the Tx Patgen 302 and the Rx Patgen 304. If the programmable hardware 104 is a FPGA card, then the code includes FPGA code.

The pattern generators (302, 304) store and execute a series of opcodes programmed into the programmable hardware 104 by a user of the tester 12. For example, the Tx Patgen 302 includes a series of opcodes executed by the Tx Patgen 302 to send bits of data the DUT 18. The Rx Patgen 304 also includes a series of opcodes executed by the Rx Patgen 304 to receive bits of data from the DUT 18.

Through the use of the two pattern generators (302, 304), flow of data to and from the DUT 18 is controllable. In one example, the Tx Patgen 302 sends data to the DUT 18 and the Rx Patgen 304 receives data from the DUT 18. Because the Tx Patgen 302 and the Rx Patgen 304 are in data communication with each other, the Tx Patgen 302 can be programmed to wait and not send more data until the Rx Patgen 304 has verified the data that it has received.

A user of the tester 12 specifies the sequence of opcodes (and the data associated with the opcodes) to be executed by the Tx Patgen 302 or the Rx Patgen 304 through computer interface 52 (FIG. 2) provided on the tester 12. For example, the user may define the sequence of opcodes executed by the Tx Patgen 302 to include "WAIT" and "Set_TX." Similarly, the user may define the sequence of opcodes executed by the Rx Patgen 304 to include "RPT" and WAIT_RX."

In some examples, the Tx Patgen 302 and the Rx Patgen 304 communicate with one another through communication links 306, 308, such a cables, electrical wires or capacitors. The Tx Patgen 302 controls the transfer of data to the DUT 18. The Rx Patgen 304 controls the receipt of data from the DUT 18. The Tx Patgen 302 sends data, referred to as a Tx Flag 310, to the Rx Patgen 304 through communication link 304. The Rx Patgen 304 sends data, referred to as a Rx Flag 312, to the Tx Patgen 302 through communication link 308.

The Tx Flag 310 includes data that informs the Rx Patgen 304 that it should start waiting to receive data from the DUT 18. In some examples, the Tx Patgen 302 sends the Tx Flag 310 at the same time as the Tx Patgen 302 sends data to the DUT 18. In other examples, the Tx Patgen 302 sends the Tx Flag 310 after sending data to the DUT 18.

The Rx Patgen 304 sends the Rx Flag 312 to the Tx Patgen 302 when then Rx Patgen 304 has received all the data it is expecting to receive and has been able to verify the accuracy or the integrity of that data. After the Rx Patgen 304 receives the data it is expecting, then the Rx Patgen sends the Rx Flag 308 to the Tx Patgen 302. The Rx Flag 312 signals the Tx Patgen 302 that is should start executing the next opcode and continue sending more data to the DUT 18.

In some examples, the Rx Patgen 304 receives data from the DUT 18 that the Rx Patgen 304 does not know how to process. In one example, the Rx Patgen 304 is not able to read the data output from an analog to digital converter on the DUT 18. In this case, the Rx Patgen 304 sends the data over communication link 314 to a capture memory device 316. The capture memory device 316 stores the data so that the semiconductor tester device 100 can access it at a later time. In this capacity, the capture memory device 316 acts as a data repository, storing the data that the Rx Patgen 304 is not able to process directly.

In some examples, the data coming into the Tx Patgen 302 and Rx Patgen 304 comes from a 48 bit wide 600 mega hertz ("MHz") dynamic random access memory ("DRAM"). In this example, the 600 MHz of clock frequency is split between the Tx Patgen 302 and the Rx Patgen 304. However, because there is some inefficiency for refresh of the data stored in DRAM of the tester 12, the opcodes executed by the Tx Patgen 302 are allotted 48 bits of data at 266 Mhz. Similarly, the opcodes executed by the Rx Patgen 304 are allotted 48 bits of data at 266 Mhz. Of the 48 bits of data, 40 bits are symbol data and 8 bits are used as control data. Table 1, below, provides an example of the transmit opcodes that may be programmed into the Tx Patgen 302:

TABLE 1

| Command (4 bits) | Operand (4 bits) | Symbol Data (40 bits) | | | |
|---|---|---|---|---|---|
| NEXT | xxxx | 10b Sym0 | 10b Sym1 | 10b Sym2 | 10b Sym3 |
| RPT | xxxx | 10b Sym0 | 10b Sym1 | 10b Sym2 | 10b Sym3 |
| BLOOP | xxxx | 10b Sym0 | 10b Sym1 | 10b Sym2 | 10b Sym3 |
| ELOOP | xxxx | 10b Sym0 | 10b Sym1 | 10b Sym2 | 10b Sym3 |
| WAIT | xxxx | 10b Sym0 | 10b Sym1 | 10b Sym2 | 10b Sym3 |
| WAIT_SPD | L, M, H | 10b Sym0 | 10b Sym1 | 10b Sym2 | 10b Sym3 |
| SET_TX | xxxx | 10b Sym0 | 10b Sym1 | 10b Sym2 | 10b Sym3 |
| SET_FL | xxxx | 10b Sym0 | 10b Sym1 | 10b Sym2 | 10b Sym3 |
| SET_ISL | xxxx | 10b Sym0 | 10b Sym1 | 10b Sym2 | 10b Sym3 |
| SET_MODE | P, L, D | 10b Sym0 | 10b Sym1 | 10b Sym2 | 10b Sym3 |
| STOP | | 10b Sym0 | 10b Sym1 | 10b Sym2 | 10b Sym3 |

As shown in table 1 above, the first four bits of the opcode designate a command, such as NEXT or RPT, to be performed by the Tx Patgen 302. The next four bits specify an operand which is used to set various control bits. The remaining 40 bits are designated as symbol data. In the example provided in Table 1, the 40 bits are sent as four symbols, with each symbol including 10 bits.

The NEXT command takes the 40 bits of symbol data and sends it out a port on the Tx Patgen 302. The RPT command also takes 40 bits of symbol data and sends it out a port on the Tx Patgen 302. Additionally, the RPT command continues sending data out of a port on the Tx Patgen 302 for a certain number of cycles, where the number of cycles is specified in the next 48 bit command. The BLOOP command acts like the NEXT command except the address of the operand is stored so that an ELOOP command can branch back to this address.

The ELOOP command sends 40 bits of data out of a port on the Tx Patgen 302. The ELOOP command also includes a loop functionality that repeats the loop a certain number of times. In the ELOOP command, a loop can be exited prematurely through three events: Match condition, Host Flag or ISL command. To that end, the remaining bits in the 48 b data field can be used for this as follows:

bit 47=Wait for RX Flag
bit 46=Wait for Host Flag
bit 45=Wait for ISL Command
bit 44:10=Reserved
no bits set=Normal Loop The WAIT command waits until an event occurs while continuing to source pin data. The WAIT commands also waits for a certain event to occur and when the event occurs execution is advanced to the next opcode.

The WAIT_SPD command is used to change pattern speed between low ("L"), medium ("M") and high ("H"). A wait count is set in the next opcode to allow the speed change to settle. Speed is selected by operand bits. The SET_TX command sends the Tx Flag 310 to the Rx Patgen 304. This is used to inform the Rx Patgen 304 that the Tx Patgen 302 has reached the flag opcode. The SET_FL command sets the host flag. The SET_ISL command sets the ISL done bit. The SET_MODE command sets mode bits as flows. In some examples, the SET_MODE command sets the Tx Patgen 302 to generate and transmit a pseudo-random binary sequence ("PRBS") pattern of data. In other examples, the SET_MODE command specifies that a loopback should be started. The STOP command stops the transfer pattern of data but continues to send the 40 bits to a port on the Tx Patgen 302.

The opcodes that may be programmed into the Rx Patgen 304 may be similar to the opcodes for the Tx Patgen 302, as illustrated in table 2 below.

opcodes used by the Tx Patgen 302, except for the ELOOP, WAIT, SET_CAP_ON, SEP_CAP_OFF and RESET commands.

For the ELOOP command and the WAIT command, additional selection bits have been added to wait for align and match conditions. The bit selections are:

bit 47=Wait for TX Flag
bit 46=Wait for Host Flag
bit 45=Wait for ISL Command
bit 44=Wait for align
bit 43=Wait for Align then Match A
bit 42=Wait for Align then Match B
bit 41=Wait for Align then Match A+B
bit 40=Capture before Match
bit 39=Capture after Match
bit 40:16=Reserved
bits 15:0=wait or loop count (loop count only 10 b)

The capture bits allow the WAIT command to wait for a data that specifies the start of a packet of data. Through execution of the WAIT instruction, the Rx Patgen 304 then waits and receives data until a match occurs at the end of the packet of data.

The SET_CAP_ON and SET_CAP_OFF commands set and clear a mode bit that determines whether captured data is stored in capture memory 316. The SET_CAP_ON command starts capturing data on the next cycle (i.e., execution of an opcode) while the SET_CAP_OFF command stops capturing data on the current cycle.

The RESET command is used to reset the align or match condition or to change the match value, where A=Align, M=Match and V=Value.

TABLE 2

| Command (4 bits) | Care field (4 bits) | Symbol Data (40 bits) | | | |
|---|---|---|---|---|---|
| NEXT | Care 4b | 10b Sym0 | 10b Sym1 | 10b Sym2 | 10b Sym3 |
| RPT | Care 4b | 10b Sym0 | 10b Sym1 | 10b Sym2 | 10b Sym3 |
| BLOOP | Care 4b | 10b Sym0 | 10b Sym1 | 10b Sym2 | 10b Sym3 |
| ELOOP | Care 4b | 10b Sym0 | 10b Sym1 | 10b Sym2 | 10b Sym3 |
| WAIT | Care 4b | 10b Sym0 | 10b Sym1 | 10b Sym2 | 10b Sym3 |
| SET_RX | Care 4b | 10b Sym0 | 10b Sym1 | 10b Sym2 | 10b Sym3 |
| SET_FL | Care 4b | 10b Sym0 | 10b Sym1 | 10b Sym2 | 10b Sym3 |
| SET_ISL | Care 4b | 10b Sym0 | 10b Sym1 | 10b Sym2 | 10b Sym3 |
| SET_CAP_ON | Care 4b | 10b Sym0 | 10b Sym1 | 10b Sym2 | 10b Sym3 |
| SET_CAP_OFF | Care 4b | 10b Sym0 | 10b Sym1 | 10b Sym2 | 10b Sym3 |
| RESET | A, M, V | Match A+ | Match B+ | Match A− | Match B− |
| STOP | xxxx | | | | |

Instead of having an operand field, the opcodes for the Rx Patgen 304 may have a CARE Field. The CARE field specifies whether the Rx Patgen 304 receives data without performing any additional operations on the received data. In some examples, the data that is received from the DUT 18 is not compared to an expected value. In these examples, 0's are placed in the respective symbol positions in the CARE field. In other examples, the CARE field specifies that the captured data should match some expected data. In one example, the CARE bit is set to specify that a match should occur between expected data and the captured data. If the captured data does not match the expected data, then a failing condition has occurred and an error, such as a decode error or a disparity error, results. In this example, the Rx Patgen 304 records the failing condition as a wrong symbol, decode error or disparity error.

Figure 9:
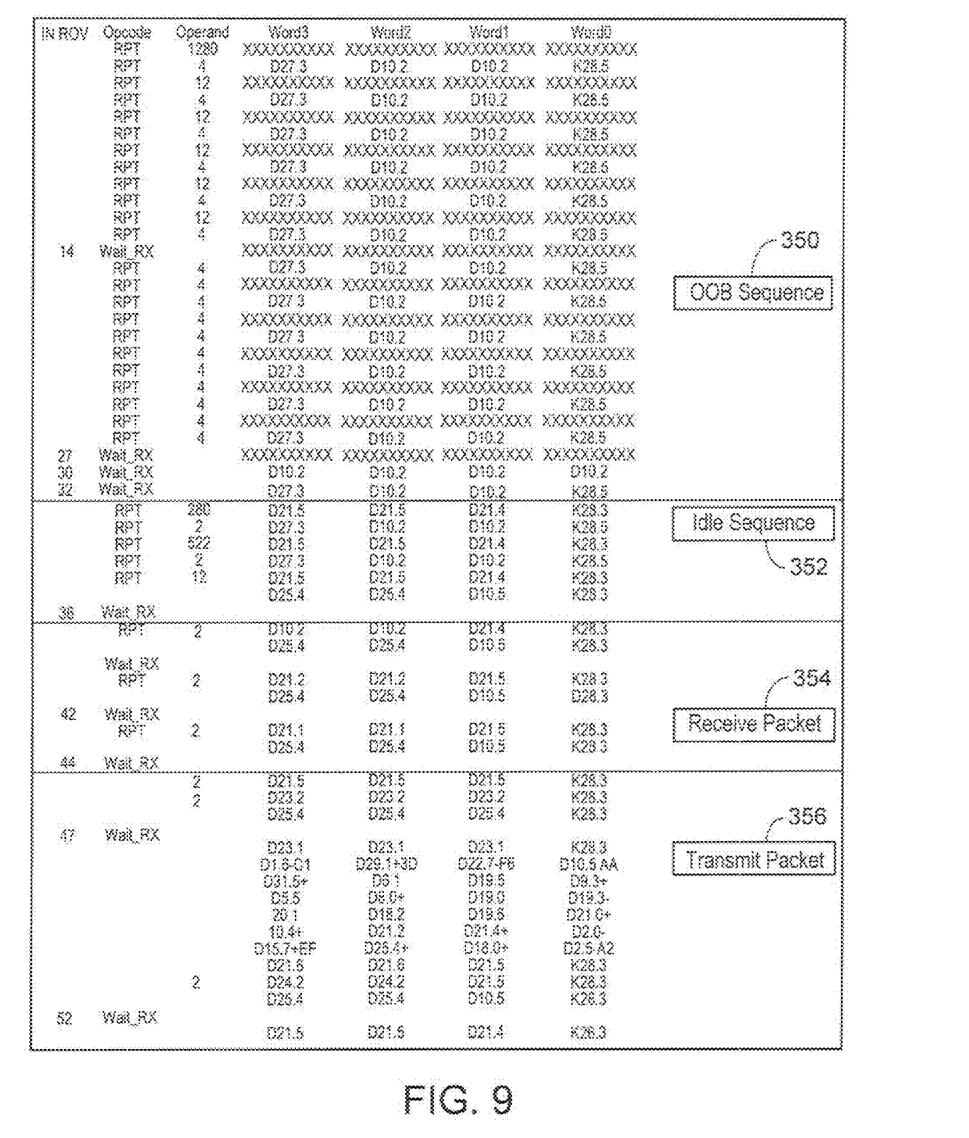
FIGS. 9 and 10 are examples of operation codes executed by pattern generators.
Figure 10:
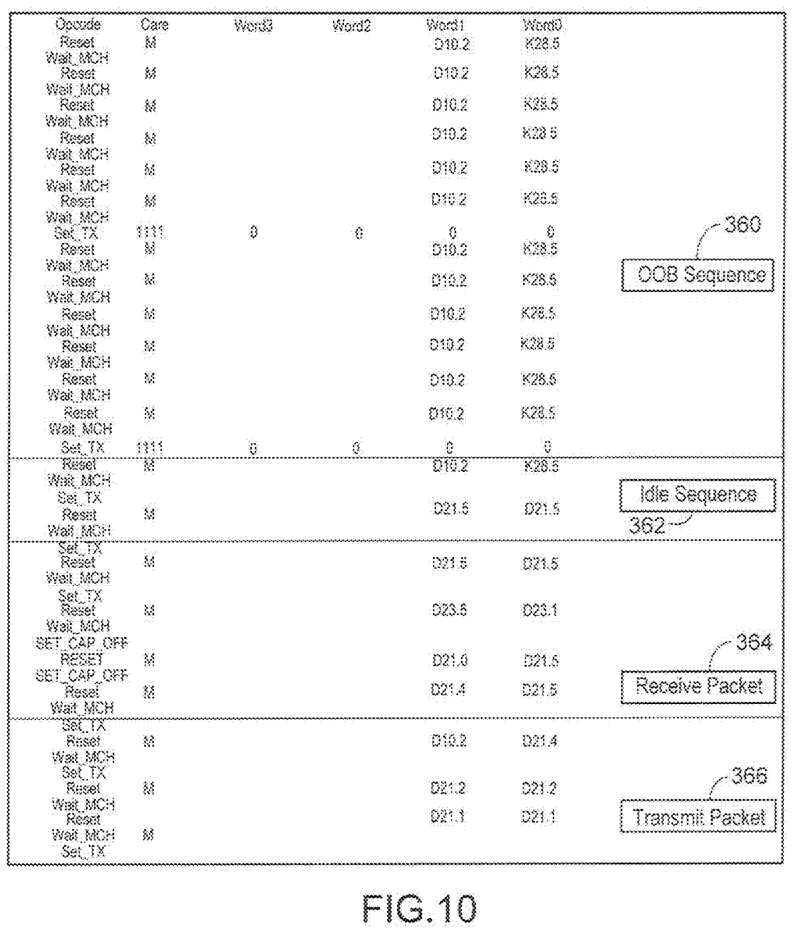

The instructions included in the opcodes used by the Rx Patgen 304 may be the same as the instructions included in the Referring to FIG. 9, the Rx Patgen 304 may be programmed with various opcode patterns, such as an out of band ("OOB") sequence 350, an idle sequence 352, a receive packet sequence 354 and a transmit packet sequence 356. For example, in the transmit packet sequence 356 of the Rx Patgen 304, the Rx Patgen 304 waits to receive data from the DUT 18, because the transmit packet sequence of the Tx Patgen 302 transmits the data to the DUT 18. Referring to FIG. 10, the Tx Patgen 302 is also programmed with various opcode patterns, such as an out of band ("OOB") sequence 360, an idle sequence 362, a receive packet sequence 364 and a transmit packet sequence 366.

Figure 6:
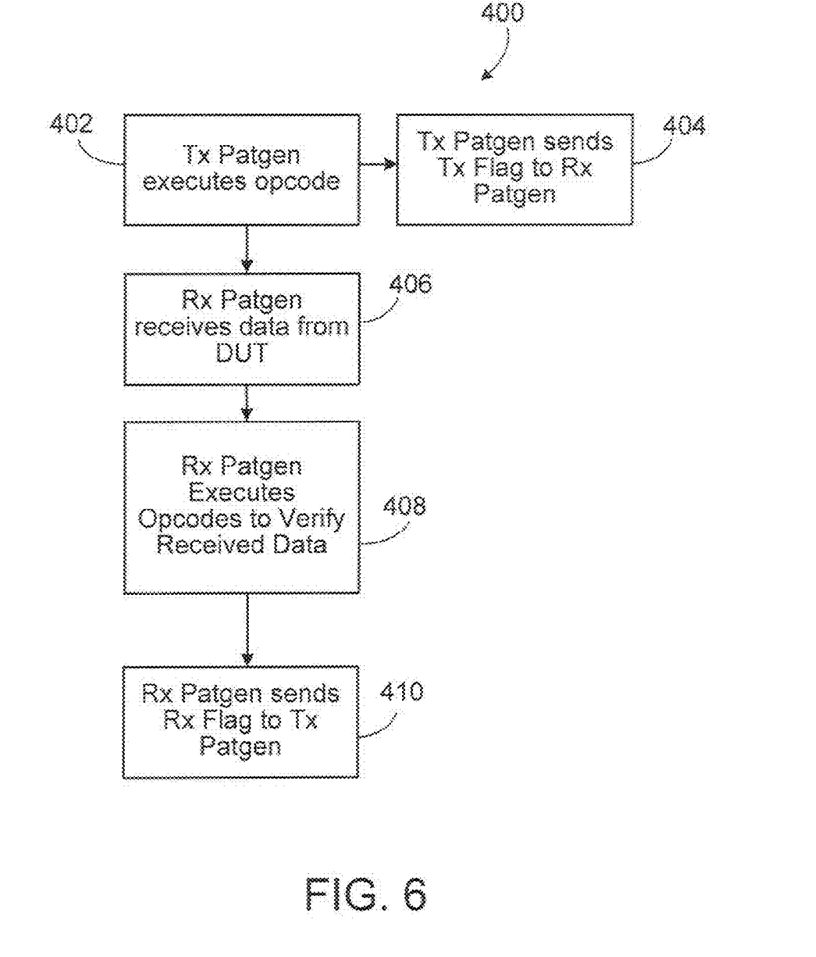

Referring to FIG. 6, the Tx Patgen 302 and the Rx Patgen 304 perform various actions (400) in testing the DUT 18. The Tx Patgen 302 executes (402) an opcode, such as an opcode including the NEXT instruction, which causes symbol data to be transferred to the DUT 18. The Tx Patgen 302 also sends (404) the Tx Flag 310 to the Rx Patgen 304. The Tx Flag 310 notifies the Rx Patgen 304 that it should start listening for data that is being sent from the DUT 18. The DUT 18 sends (406) data to the Rx Patgen 304. The Rx Patgen 304 executes (408) its opcodes against the received data to verify that is has received specific data. The Rx Patgen 304 sends (410) the Rx Flag 312 to the Tx Patgen 302.

Figure 7:
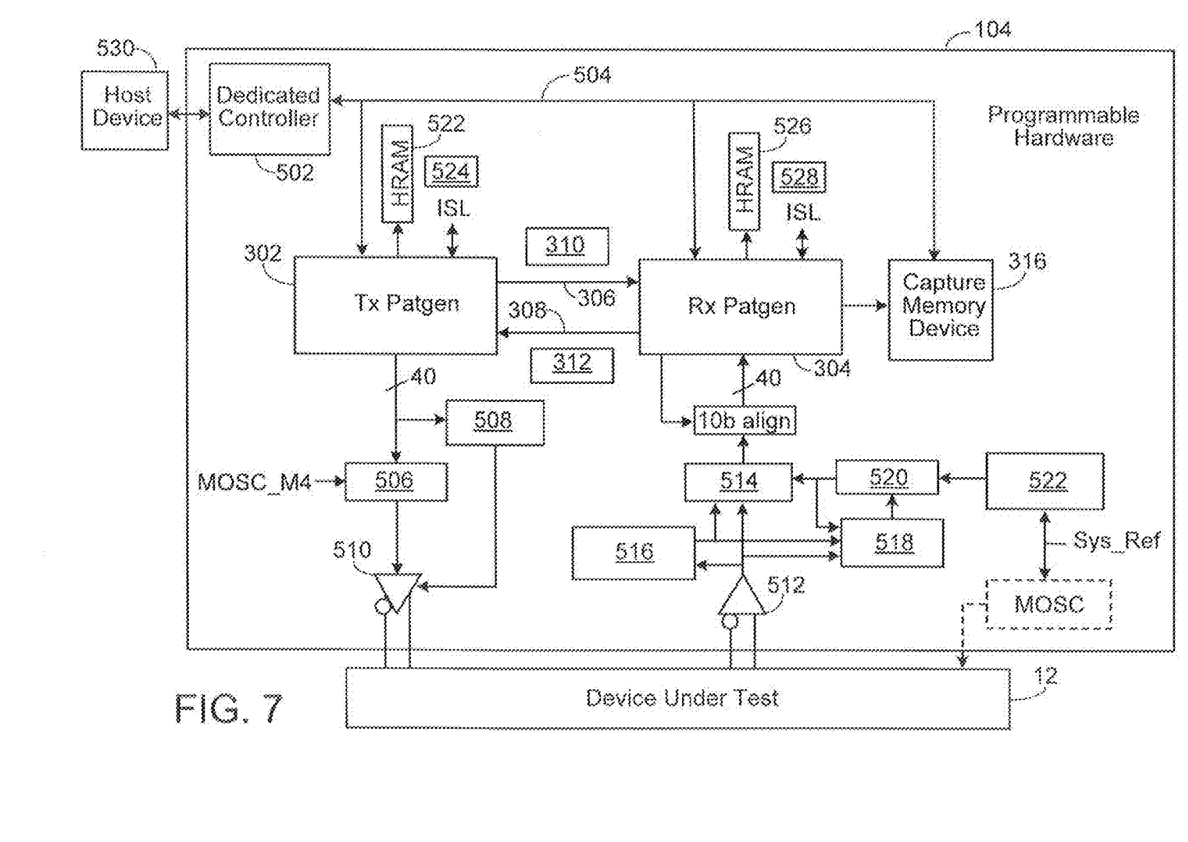

Referring to FIG. 7, in some embodiments, a dedicated controller 502 is part of the programmable hardware 104 and is used to control the execution of opcodes by the Tx Patgen 302 and the Rx Patgen 304. A dedicated controller 502 is used when the DUT 18 sends back numerous types of data and the Rx Patgen 304 does not know how to process the various received forms of data. In this case, the Rx Patgen 304 sends the received data to the dedicated controller 502 over communication link 504. In another case, the Rx Patgen 304 sends the received data to the capture memory device 316 and the dedicated controller 502 has access to the capture memory device 316. The Rx Patgen 304 sends a message to the dedicated controller 502 alerting the dedicated controller 502 that the Rx Patgen 304 has received data. The dedicated controller 502 then accesses the received data from the capture memory device 316. The dedicated controller 502 analyzes the received data to determine the opcode that should be executed by the Tx Patgen 302. The dedicated controller 502 then instructs the Tx Patgen 302 on the opcode to execute next.

In some examples, the Tx Patgen 302 and the Rx Patgen 304 do not communicate directly with each other through the Tx Flags 310 and the Rx Flags 312. Instead, the dedicated controller 502 processes the data received from the Rx Patgen 304 and sends data back to the Rx Patgen 304 informing the Rx Patgen 304 of any additional opcodes it should execute, such as opcodes to wait to receive more data or opcodes to perform a comparison match between the data received and the data that the Rx Patgen 304 expected to receive. After the dedicated controller 502 has processed the data received from the Rx Patgen 304, the dedicated controller 502 sends a command to the Tx Patgen 302 that tells the Tx Patgen 302 which opcode to execute next.

In some examples, the Tx Patgen 302 and the Rx Patgen 304 use the dedicated controller 502 in conjunction with communication links 306, 312 and Tx and Rx Flags 310, 312 in determining appropriate opcodes for execution. In one example, the Rx Patgen 304 receives some data from DUT 18 that the Rx Patgen 304 is directly able to process and determine the appropriate opcodes for execution. However, the Rx Patgen 304 may also receive other data that it is not able to process. In this case, the Rx Patgen 304 passes the data to the dedicated controller 502. The dedicated controller 502 processes the data and sends the Rx Patgen 304, over communication link 504, instructions on which opcode to execute next.

Figure 8:
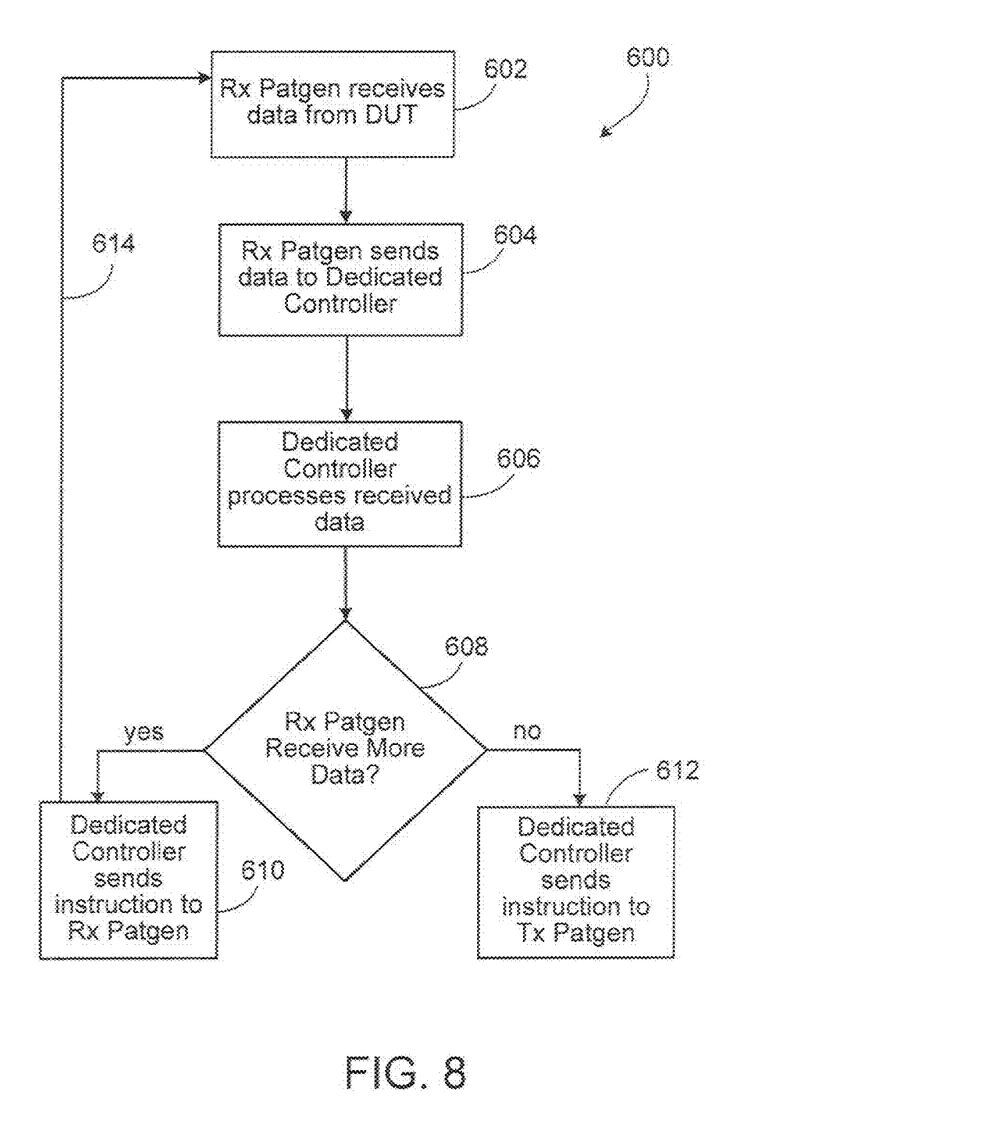

Referring to FIG. 8, the Rx Patgen 304, Tx Patgen 302 and the dedicated controller 502 perform various actions 600 in the process of sending data to and receiving data from the DUT 18. The Rx Patgen 304 receives (602) data from the DUT 18. The Rx Patgen 302 sends (604) the received data to the dedicated controller 502. The dedicated controller 502 processes (606) the data received from the Rx Patgen 304. The dedicated controller 502 determines (608) whether the Rx Patgen 304 needs to wait to receive more data from the DUT 18. If the dedicated controller 502 determines that the Rx Patgen 304 needs to receive more data or needs to execute additional opcodes, then the dedicated controller 502 sends (610) additional instructions specifying the opcodes to execute to the Rx Patgen 304. This cycle 614 of the Rx Patgen 304 receiving data from the DUT 18 and passing the received data to the dedicated controller 502 continues until the dedicated controller 502 has determined that the Rx Patgen 304 has received all the data it needs. If the dedicated controller 502 determines that the Rx Patgen 304 has received all the data that it needs, then the dedicated controller 502 passes (612) a command to the Tx Patgen 302. The command that is passed to the Tx Patgen 302 may specify the opcode that the Tx Patgen 302 should send to the DUT 18. The Tx Patgen 302 may send an opcode to the DUT 18.

The programmable hardware 104 may include standard circuitry elements. In one example, symbol data sent from the Tx Patgen 302 to the DUT 18 is sent through a parallel-to-serial converter 506 or an out of band detection device 508. The symbol data then passes through a logic gate 510, the output of which is sent to the DUT 18. On the receiving end, the DUT 18 passes data back to the tester 12 and the programmable hardware 104. The received data is passed through a logic gate 512 that is part of the tester 12. In some examples, the received data is also passed through an out of band detection device 514 to determine whether the received data is outside of a previously established communication channel. The received data is then passed to a serial to parallel converter 514 and is sent to the Rx Patgen 304. The 10 b align looks at the bit stream and decides where to place the 10 b symbol boundaries based on the align character the 10 b align is looking for.

In some examples, the received data is sent to a tracker 518 and fed through a delay device 520. The tracker 518 examines the data transitions and moves the phase of the clock comparator strobe (our clock) around so that the clock is in the center of the data eye. In some examples, a master oscillator ("MOSC") acts as an onboard clock.

In some examples, the Tx Patgen 302 is connected to hierarchical random access memory ("HRAM") 522 and an instrument sync link ("ISL") 524 to synchronize events between the Tx Patgen 302 and the Rx Patgen 304. The Rx Patgen 304 is also connected to an HRAM 526 and ISL 528. In some examples, the dedicated controller 502 is interfaced with a host device 530, such as a server or other computing device.

A number of embodiments have been described. Nevertheless, it will be understood that various modifications may be made. Accordingly, other embodiments are within the scope of the following claims.

What is claimed is:

1. A semiconductor device tester comprising:
programmable hardware configured to test a semiconductor device under test;
wherein the programmable hardware is programmed with pattern generators to control data flow to and from the semiconductor device under test, wherein the pattern generators comprise:
a transmit pattern generator for transmission of first data to the semiconductor device under test; and
a receive pattern generator for receipt of second data from the semiconductor device under test;
wherein the transmit pattern generator is programmed to wait, until the receive pattern generator has verified the second data, to transmit third data to the semiconductor device under test.

2. The semiconductor device tester of claim 1, wherein the transmit pattern generator is configured to send, to the receive pattern generator, an electrical signal notifying the receive pattern generator to start waiting to receive the second data from the semiconductor device under test; and
wherein the transmit pattern generator is configured to send the electrical signal, following transmission of the first data to the semiconductor device under test.

3. The semiconductor device tester of claim 1, wherein the receive pattern generator is configured to execute one or more operation codes against the second data received from the semiconductor device under test.

4. The semiconductor device tester of claim 1, wherein the transmit pattern generator and the receive pattern generator are configured for communication.

5. The semiconductor device tester of claim 1, wherein the receive pattern generator is configured to verify the second data received.

6. The semiconductor device tester of claim 5, wherein the receive pattern generator is configured to send, to the transmit pattern generator following verification of the second data received, an electrical signal, the electrical signal comprising data indicating that the transmit pattern generator should transmit the third data to the semiconductor device under test.

7. The semiconductor device tester of claim 1, wherein the transmit pattern generator is configured to execute one or more operation codes specifying the third data to be transmitted.

8. The semiconductor device tester of claim 1, further comprising a data controller to control the data flow out of and into the programmable hardware.

9. The semiconductor device tester of claim 8, wherein the data controller is configured for communication with the transmit pattern generator; and
the data controller is configured to send a command to the transmit pattern generator, the command comprising one or more operation codes to be executed by the transmit pattern generator.

10. The semiconductor device tester of claim 8, wherein the data controller is configured for communication with the receive pattern generator; and
the data controller is configured to send a command to the receive pattern generator, the command comprising one or more operation codes to be executed by the receive pattern generator.

11. A method of testing a semiconductor device, the method comprising:
programming hardware to test the semiconductor device, wherein the hardware is programmed with:
a transmit pattern generator for transmission of first data to the semiconductor device; and
a receive pattern generator for receipt of second data from the semiconductor device;
wherein the transmit pattern generator is programmed to wait, until the receive pattern generator has verified the second data, to transmit third data to the semiconductor device.

12. The method of claim 11, further comprising:
sending one or more bits of the first data to the semiconductor device; and
receiving one or more bits of the second data from the semiconductor device.

13. The method of claim 12, further comprising:
executing, by the transmit pattern generator, one or more operation codes specifying the first data to be sent.

14. The method of claim 12, further comprising:
executing one or more operation codes against the one or more bits of the second data received from the semiconductor device.

15. The method of claim 11, further comprising:
waiting to receive an electrical signal from the receive pattern generator, prior to sending bits of the third data to the semiconductor device.

16. Programmable hardware configured to store instructions for a transmit pattern generator and a receive pattern generator, wherein the instructions are executable by a semiconductor device to perform operations comprising:
transmitting, by the transmit pattern generator, one or more bits of first data to a semiconductor device under test; and
receiving, by the receive pattern generator, one or more bits of second data from the semiconductor device under test;
wherein the transmit pattern generator is programmed to wait, until the receive pattern generator has verified the second data, to transmit third data to the semiconductor device under test.

17. The programmable hardware of claim 16, wherein the transmit pattern generator is configured to send, to the receive pattern generator, an electrical signal notifying the receive pattern generator to start waiting to receive the second data from the semiconductor device under test; and
wherein the transmit pattern generator is configured to send the electrical signal, following transmission of the first data, to the semiconductor device under test.

18. The programmable hardware of claim 16, wherein the receive pattern generator is configured to execute one or more operation codes against the second data received from the semiconductor device under test.

19. The programmable hardware of claim 16, wherein the transmit pattern generator and the receive pattern generator are configured for communication.

20. The programmable hardware of claim 16, wherein the transmit pattern generator is configured to execute one or more operation codes specifying the third data to be transmitted.

* * * * *